(12) United States Patent
Lee

(10) Patent No.: US 7,724,584 B2
(45) Date of Patent: May 25, 2010

(54) SEMICONDUCTOR MEMORY DEVICE AND METHOD OF COMPENSATING FOR SIGNAL INTERFERENCE THEREOF

(75) Inventor: Hyun-Bae Lee, Hwaseong-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 110 days.

(21) Appl. No.: 12/177,260

(22) Filed: Jul. 22, 2008

(65) Prior Publication Data

US 2009/0040840 A1    Feb. 12, 2009

(30) Foreign Application Priority Data

Aug. 9, 2007    (KR) .................. 10-2007-0080196

(51) Int. Cl.
*G11C 7/00* (2006.01)
(52) U.S. Cl. ............. 365/189.11; 365/191; 365/230.03; 365/194
(58) Field of Classification Search ............ 365/189.11, 365/191, 194, 230.03, 230.08, 230.02
See application file for complete search history.

(56) References Cited

U.S. PATENT DOCUMENTS 6,522,564 B2    2/2003    Won
7,570,525 B2 *    8/2009    Nii et al. ................. 365/189.11

FOREIGN PATENT DOCUMENTS

| KR | 10-0380387 | 8/2002 |
|---|---|---|
| KR | 10-0382740 | 11/2002 |
| KR | 10-0687866 | 10/2005 |

* cited by examiner

*Primary Examiner*—David Lam
(74) *Attorney, Agent, or Firm*—F. Chau & Associates, LLC

(57) ABSTRACT

A semiconductor memory device includes a memory cell array including a plurality of memory cell array blocks, a plurality of pairs of first data lines for transceiving data with corresponding memory cell array blocks, a plurality of column selection signal lines disposed in an orthogonal direction to the pairs of first data lines, and a plurality of pairs of second data lines to transceive data with corresponding pairs of first data lines of the pairs of first data lines. The memory cell array includes a signal interference compensator that shifts a voltage level of a second data line signal of one of the pair of second data lines interfered by a column selection signal line, to a voltage level of a first data line signal of other of the pair of second data lines not interfered so as to compensate for a signal interference.

20 Claims, 7 Drawing Sheets

SEMICONDUCTOR MEMORY DEVICE AND METHOD OF COMPENSATING FOR SIGNAL INTERFERENCE THEREOF

CROSS REFERENCE TO RELATED APPLICATION

This application claims the benefit of Korean Patent Application No. 2007-80196, filed Aug. 9, 2007, the contents of which are hereby incorporated herein by reference in their entirety.

BACKGROUND OF THE INVENTION

1. Technical Field

The present disclosure relates to a semiconductor memory device and, more particularly, to a method of compensating for signal interference of the semiconductor memory device.

2. Discussion of the Related Art

In order to realize high-capacity high-speed semiconductor memory devices, pairs of local data input/output lines are disposed as data input/output lines, and column selection signal lines and pairs of global data input/output lines are disposed in a direction orthogonal to the pairs of local data input/output lines.

However, as the integration density of semiconductor memory devices increases, signal intensity decreases and the number of signal lines increases. Thus, it is necessary to dispose a greater number of signal lines and circuits in limited areas of the semiconductor devices so as to minimize the load of signal lines.

In a conventional semiconductor memory device, when a signal is applied to a column selection signal line to read data from a memory cell, data is transmitted via a pair of global data input/output lines to a global data input/output multiplexer in response to the applied signal.

The column selection signal line is a full-swing signal line that transitions from a power supply voltage to a ground voltage, and the pair of global data input/output lines are a pair of small-swing signal lines that transition from a precharge level to a complementary level. When the column selection signal line is in a full swing, the pair of global data input/output lines are affected by interference due to coupling capacitances between the column selection signal line and the pair of global data input/output lines.

That is, when a signal is applied to a column selection signal line disposed adjacent to the pair of global data input/output lines, interference occurs at the pair of small-swing global data input/output lines so that a signal applied to the pair of small-swing global data input/output lines is delayed, as compared to when no interference occurs, before it is transmitted to the global data input/output multiplexer.

As a result, a data read speed of the entire semiconductor memory device is degraded. Furthermore, with the development of high-capacity semiconductor memory devices, the length of the pair of global data input/output lines continues to increase, further degrading the data read speed and affecting the performance of the entire semiconductor memory device.

Various methods have been proposed to address the above issues. For example, a signal line for transmitting global input/output data signals with very low intensity may be shielded using power lines to avoid coupling with other signal lines. Alternatively, interference caused by a column selection signal line may be reduced by half using a pair of twisted global data input/output lines GI01-GI0B, as shown in FIG. 1.

FIG. 1 is a block diagram of a conventional semiconductor memory device using a pair of twisted global data input/output lines.

Referring to FIG. 1, the semiconductor memory device includes four memory cell array blocks BL1 to BL4, a plurality of local data input/output lines (LIO1, LIO1B) to (LIO4, LIO4B), a word line WL, a plurality of column selection signal lines CSL1 to CSLn, a plurality of global data input/output lines (GIO1, GIO1B), (GIO2, GIO2B), . . . , and a column address decoder 10.

An upper left memory array region of the semiconductor memory device including the memory cell array blocks BL1 to BL4, the local data input/output lines (LIO1, LIO1B) to (LIO4, LIO4B), the column selection signal lines CSL1 to CSLn, and the global data input/output lines (GIO1, GIO1B), (GIO2, GIO2B), . . . will be described. A memory cell MC, a bit line sense amplifier BLSA, and a column selection circuit 20 are connected between the word line WL and a pair of bit lines BLP1. A local input/output sense amplifier Local IOSA is disposed at an intersection point between the pair of local data input/output lines LIO1 and LIO1B and the pair of global data input/output lines GIO1 and GIO1B. Also, an input/output sense amplifier IOSA and a global input/output multiplexer GIOMUX are connected between the pair of global data input/output lines GIO1 and GIO1B.

As can be seen from FIG. 1, the word line WL and the plurality of column selection signal lines CSL1 to CSLn are adjacently arranged in the same direction as, or in an orthogonal direction to, the plurality of local data input/output lines (LIO1, LIO1B) to (LIO4, LIO4B), and the plurality of global data input/output lines (GIO1, GIO1B), (GIO2, GIO2B), . . . are twisted pairs.

Functions of respective blocks of the conventional semiconductor memory device will now be described with reference to FIG. 1.

A memory cell MC receives a signal of the word line WL, which is enabled in response to a row address, and outputs written/stored data to a pair of bit lines BL and BLB.

The bit line sense amplifier BLSA receives charges stored in a capacitor of the memory cell MC via the pair of bit lines BL and BLB and amplifies a voltage corresponding to the charges.

The column address decoder 10 receives a column address CA, decodes the column address CA, and enables one of a plurality of column selection signals CSL1, CSL2, . . . , and CSLn of the four memory cell array blocks BL1 to BL4.

The column selection circuit 20 is composed of two NMOS transistors N1 and N2 each having one terminal to which a pair of output signals LIO and LIOB of the bit line sense amplifier BLSA are applied, respectively, and gate terminals to which the column selection signal CSL1 is applied. The column selection circuit 20 externally receives a column address along with a read command, turns on the NMOS transistors N1 and N2 in response to the enabled column selection signal CSL1, and transmits data signals of the pair of sensed bit lines BL and BLB to the pair of local input/output lines LIO and LIOB.

The local input/output sense amplifier Local IOSA receives data of the transmitted bit line signals BL and BLB, amplifies a voltage difference between the bit line signals BL and BLB, and outputs an amplified signal, thereby preventing an operating speed from being degraded due to a load mismatch between the pair of local input/output lines LIO and LIOB having a small load, and the pair of global input/output lines GIO and GIOB having a large load.

The global data input/output multiplexer GIOMUX receives the amplified signal from the local input/output sense amplifier Local IOSA through the global input/output lines GIO and GIOB, converts N-bit parallel data of the pair of global input/output lines GIO and GIOB into M serial data, and outputs the converted data.

The input/output sense amplifier IOSA receives the converted serial data of the global input/output lines GIO and GIOB, amplifies a voltage difference between the received data, and outputs an amplified signal.

FIG. 2 is a circuit diagram for modeling a coupling capacitance between a column selection signal line (CSL1) and a pair of global data input/output lines (GI01, GI01B) in the conventional semiconductor memory device shown in FIG. 1.

The column selection signal line CSL1 and the pair of global data input/output lines GIO1 and GIOB1 are divided into three portions. A coupling capacitance between the column selection signal line CSL1 and the global data input/output line GIO1 includes capacitances CA1, CB3, CC1, and CD3. A coupling capacitance between the pair of global data input/output lines GIO1 and GIO1B includes capacitances CA2, CB2, CC2, and CD2. Also, a coupling capacitance between the column selection signal line CSL1 and the global data input/output line bar GIO1B includes capacitances CA3, CB1, CC3, and CD1.

During the enabling and disabling of the column selection signal line CSL1, the sum (CA1+CC1) of the coupling capacitances between the column selection signal line CSL1 and the global data input/output line GIO1 affects the global data input/output line GIO1 causing a voltage variation in the global data input/output line GIO1. Also, the sum (CB1+CD1) of the coupling capacitances between the column selection signal line CSL1 and the global data input/output line bar GIO1B affects the global data input/output line bar GIO1B causing a voltage variation in the global data input/output line bar GIO1B.

Accordingly, the voltage variations in the pair of twisted global data input/output lines GIO1 and GIO1B caused by a voltage variation in the column selection signal line CSL1 are reduced compared to when a pair of global data input/output lines GIO1 and GIO1 are not twisted.

For example, assuming that each of the coupling capacitances CA1, CB1, CC1, and CD1 is equal to a capacitance C, in the conventional semiconductor memory device including the pair of untwisted global data input/output lines GIO1 and GIO1B, a voltage of the global data input/output line GIO1 is largely affected by a voltage variation in the column selection signal line CSL1 due to a coupling capacitance 4C between the column selection signal line CSL1 and the global data input/output line GIO1. In contrast, in the semiconductor memory device shown in FIG. 1, the coupling capacitance between the column selection signal line CSL1 and the global data input/output line GIO1, and the coupling capacitance between the column selection signal line CSL2 and the global data input/output line GIO1B, is reduced to a capacitance 2C, thereby reducing a voltage variation in the pair of global data input/output lines GIO1 and GIO1B caused by a voltage variation in the column selection signal line CSL1. FIG. 3 is a timing diagram illustrating the operation of a memory cell array block BL1 of the conventional semiconductor memory device shown in FIG. 1.

The operation of the memory cell array block BL1 is affected by the input and output of a row address strobe signal RASB, a column address strobe signal CASB, an address signal ADD, a write enable signal WEB, a word line enable signal WL, a precharge signal PRE, a first column selection signal CSL1, a second column selection signal CSL2, a pair of bit line signals BLP1, a pair of local data input/output line signals LIO1 and LIO1B, and a pair of global data input/output line signals GIO1 and GIO1B.

In FIG. 3, assuming that a high-level inverted write enable signal WEB is applied to read low-level data from the pair of bit lines BLP1, when a low-level row address strobe signal RASB is applied, the address signal ADD loads a row address X, and when a low-level column address strobe signal CASB is applied, the address signal ADD loads a column address Y1.

The row address X is decoded to generate a high-level word line enable signal WL, and the column address Y1 is decoded to generate a high-level column selection signal CSL1.

Also, when a high-level precharge signal PRE is generated before the high-level word line enable signal WL is generated, the pair of bit lines BLP1, the pair of local data input/output lines LIO1 and LIO1B, and the pair of global data input/output lines GIO1 and GIO1B are precharged in response to the high-level precharge signal PRE.

When the high-level word line enable signal WL is generated, a voltage difference between data signals transmitted to the pair of bit lines BLP1 develops, and the bit line sense amplifier BLSA amplifies the voltage difference between the data signals transmitted to the pair of bit lines BLP1 to a complementary level.

When the high-level column selection signal CSL1 is generated, the data signals of the pair of bit lines BLP1 are respectively transmitted to the pair of local data input/output lines LIO1 and LIO1B, transmitted to the pairs of global data input/output lines GIO1 and GIO1B, and amplified by the input/output sense amplifier IOSA.

Meanwhile, after a predetermined time elapses, when the column address strobe signal CASB returns to a low level and the address signal ADD loads a column address Y2, the column address decoder 10 decodes the column address Y2 and generates a high-level second column selection signal CSL2.

Thus, when the first column selection signal CSL1 is enabled to a high level, a voltage difference between data signals transmitted to the pair of bit lines BLP1 develops so that the bit line sense amplifier BLSA amplifies the voltage difference between the data signals transmitted to the pair of bit lines BLP1 to a complementary level, and the data signals of the pair of bit lines BLP1 are respectively transmitted to the pair of local data input/output lines LIO1 and LIO1B and the pair of global data input/output lines GIO1 and GIO1B, and amplified by the input/output sense amplifier IOSA.

However, since the global data input/output line bar signal GIO1B is being interfered by the second column selection signal CSL2, the phases of the pair of global data input/output line signals GIO1 and GIO1B are opposite to the phases of the pair of global data input/output line signals GIO1 and GIO1B generated when the global data input/output line signal GIO1 is being interfered by the first column selection signal CSL1.

When the voltage difference between the data signals transmitted to the pair of global data input/output lines GIO1 and GIO1B is produced, the input/output sense amplifier IOSA senses and amplifies the voltage difference between the data signals transmitted to the pair of global data input/output lines GIO1 and GIO1B. Therefore, because the moment when the voltage difference between the data signals transmitted to the pair of global data input/output lines GIO1 and GIO1B is earlier, a read access time becomes shorter.

However, in the conventional semiconductor memory device, when the twisted pair of global data input/output lines GIO1 and GIO1B is disposed adjacent to the column selection signal line CSL1, a coupling capacitance exists between the twisted pair of global data input/output lines GIO1 and GIO1B as shown in FIG. 2. Thus, the coupling capacitance between the twisted pair of global data input/output lines GIO1 and GIO1B affects the data signals transmitted thereto.

In other words, during the enabling and disabling of the column selection signal line CSL1, a voltage of the twisted pair of global data input/output lines GIO1 and GIO1B is affected by a small capacitance and instantaneously rises or drops to a voltage that is lower by $\Delta V1$ than in the conventional semiconductor memory device including the pair of untwisted global data input/output lines GIO1 and GIO1B.

Thus, because the moment when the voltage difference between the data signals transmitted to the pair of global data input/output lines GIO1 and GIO1B is produced is earlier by $\Delta T1$ than in the conventional semiconductor memory device, including the pair of untwisted global data input/output lines GIO1 and GIO1B, a read data access time is improved.

However, since the conventional semiconductor memory device shown in FIG. 1 includes the twisted pair of global data input/output lines GIO1 and GIO1B, layers of the pair of global data input/output lines GIO1 and GIO1B need to be changed using contacts (e.g., vias). As a result, transmitted signals are delayed due to proper resistance elements, and the pair of global data input/output lines GIO1 and GIO1B is highly likely to be positionally deviated during a semiconductor fabrication process.

Furthermore, since data written to or read from the actual memory cell MC is transmitted through the pair of global data input/output lines GIO1 and GIO1B, when the pair of global data input/output lines GIO1 and GIO1B is positionally deviated, not only data read performance but also data write performance may be degraded, and data encoding must be reversed at portions where the pair of global data input/output lines GIO1 and GIO1B are twisted, thereby complicating circuit design.

SUMMARY OF THE INVENTION

Exemplary embodiments of the invention seek to provide a semiconductor memory device, which adaptively shifts a voltage of an interfered data line signal to a voltage of an uninterfered data line signal to compensate for signal interference, thereby preventing degradation of a data read speed due to signal interference of a column selection signal line disposed adjacent to a pair of data signal lines.

Another exemplary embodiment of the present invention seeks to provide a method of compensating for signal interference of the above-described semiconductor memory device.

A semiconductor memory device, according to an exemplary embodiment of the present invention, includes a memory cell array including a plurality of memory cell array blocks; a plurality of pairs of first data lines for transceiving data with corresponding memory cell array blocks of the memory cell array blocks; a plurality of column selection signal lines disposed in an orthogonal direction to the pairs of first data lines; and a plurality of pairs of second data lines disposed adjacent and parallel to the column selection signal lines to transceive data with corresponding pairs of first data lines of the pairs of first data lines. The memory cell array includes a signal interference compensator that shifts a voltage level of a second data line signal of one of the pair of second data lines disposed adjacent to and interfered by one of the plurality of column selection signal lines, to a voltage level of a first data line signal of the pair of second data lines that is not interfered by the column selection signal lines so as to compensate for a signal interference.

Each of the plurality of memory cell array blocks may include a plurality of pairs of bit lines disposed parallel to the plurality of pairs of second data lines; a word line disposed in an orthogonal direction to the plurality of pairs of bit lines; a plurality of memory cells, each memory cell having a first terminal connected to one of a corresponding pair of bit lines and a second terminal connected to the word line to output read data to the corresponding pair of bit lines; and an address selection circuit for receiving a pair of amplified bit line signals and for transmitting the pair of amplified bit line signals to a corresponding pair of first data lines.

The semiconductor memory device may further include an address decoder for receiving an external address and decoding the external address to enable one of a plurality of column selection signals; a data input/output multiplexer for receiving an output signal from the signal interference compensator and converting N-bit parallel data of the pair of second data lines into M serial data to output converted data; and an input/output sense amplifier for receiving the M serial data and amplifying voltage level of the serial data to output amplified serial data.

The semiconductor memory device may further include an enable signal generator for outputting a signal interference compensation enable signal and first and second data line enable signals in response to first and second column selection signals, which are sequentially enabled out of the plurality of column selection signals, to enable the signal interference compensator before read data is transmitted to the signal interference compensator.

The signal interference compensator may receive the interfered second data line signal and the uninterfered first data line signal via first and second input terminals, respectively, and generate a signal obtained by amplifying a voltage difference between the first and second input terminals via a first or a second output terminal using a differential amplification operation, and the signal interference compensator may apply the amplified signal to the interfered second data line and the first or the second input terminal and perform unity gain amplification while repeating the differential amplification operation to maintain a voltage of the first or the second output terminal constant.

The signal interference compensator may include a differential amplifier for receiving the interfered second data line signal via the first input terminal, receiving the uninterfered first data line signal via the second input terminal, and amplifying the voltage difference between the two received signal to output the amplified signal; and first and second transistors having first terminals respectively connected to the first and second output terminals of the differential amplifier, gate terminals to which the first and second data line enable signals are respectively applied, and second terminals respectively connected to the first and second data lines.

The differential amplifier may be a unity gain amplifier that receives an output signal output from the first or second output terminals of the differential amplifier via the first or the second input terminal in response to each of the first and second data line enable signals.

The first and second transistors of the semiconductor memory device may be PMOS transistors or NMOS transistors that control the enabling of the signal interference compensator.

The enable signal generator may include a first column selection signal processor for receiving the enabled first column selection signal, delaying the enabled first column selection signal for a predetermined time, and performing a first logic exclusive OR (XOR) on the delayed enabled first column selection signal and a signal obtained by buffering the enabled first column selection signal to output a first XOR output signal; a second column selection signal processor for receiving the enabled second column selection signal, delaying the enabled second column selection signal for a predetermined time, and performing a second logic XOR on the delayed enabled second column selection signal and a signal obtained by buffering the enabled second column selection signal to output a second XOR output signal; a first inverter for receiving the first XOR output signal and inverting the level of the first XOR output signal to output the first data line enable signal; a second inverter for receiving the second XOR output signal and inverting the level of the second XOR output signal to output the second data line enable signal; and an XOR gate for receiving the first and second XOR output signals and performing a logic XOR on the first and second XOR output signals to output the signal interference compensation enable signal.

The first column selection signal processor may include a first buffer for receiving the enabled first column selection signal and buffering the enabled first column selection signal to output the buffered signal; a first pulse generator for receiving the enabled first column selection signal, delaying the enabled first column selection signal for a predetermined time, and performing a logic NAND on the delayed signal and the enabled first column selection signal to output a first pulse signal having a predetermined cycle; and a first XOR gate for receiving the buffered first column selection signal and the first pulse signal and performing a logic XOR on the buffered first column selection signal and the first pulse signal to output a third XOR output signal.

The first pulse generator may include a first delay circuit for receiving the enabled first column selection signal and delaying the enabled first column selection signal for a predetermined time to output the delayed signal; a first NAND gate for receiving the enabled first column selection signal and the delayed first column selection signal and performing the logic NAND on the enabled first column selection signal and the delayed first column selection signal to output a first NAND output signal; and a first inverting portion for receiving the first NAND output signal and inverting the level of the first NAND output signal to output the first pulse signal.

The first delay circuit may include a plurality of serially connected inverters, each inverter having an input terminal to which the enabled first column selection signal is applied and an output terminal connected to the first NAND gate.

The second column selection signal processor may include a second buffer for receiving the enabled second column selection signal and buffering the enabled second column selection signal to output the buffered signal; a second pulse generator for receiving the enabled second column selection signal, delaying the enabled second column selection signal for a predetermined time, and performing a logic NAND on the delayed signal and the enabled second column selection signal to output a second pulse signal having a predetermined cycle; and a second XOR gate for receiving the second-inverted signal and the buffered second column selection signal and performing a logic XOR on the second-inverted signal and the buffered first column selection signal to output a fourth XOR output signal.

The second pulse generator may include a second delay circuit for receiving the enabled second column selection signal and delaying the enabled second column selection signal for a predetermined time to output the delayed signal; a second NAND gate for receiving the enabled second column selection signal and the delayed second column selection signal and performing the logic NAND on the enabled second column selection signal and the delayed second column selection signal to output a second NAND output signal; and a second inverting portion for receiving the second NAND output signal and inverting the level of the second NAND output signal to output the second pulse signal.

The second delay circuit may include a plurality of serially connected inverters, each inverter having an input terminal to which the enabled second column selection signal is applied and an output terminal connected to the second NAND gate.

A method of compensating for signal interference of a semiconductor memory device, according to an exemplary embodiment of the present invention, includes a plurality of memory cell array blocks; a plurality of pairs of first data lines disposed to respectively correspond to the memory cell array blocks; a plurality of column selection signal lines disposed in an orthogonal direction to the pairs of first data lines; and a plurality of pairs of second data lines disposed adjacent and parallel to the column selection signal lines. The method includes an address decoding step of receiving an external address and decoding the external address to sequentially enable a plurality of column selection signals; an enable signal generation step of outputting a signal interference compensation enable signal and first and second data line enable signals in response to the sequentially enabled column selection signals; and a signal interference compensation step of shifting a voltage level of a second data line signal of one of the pair of second data lines interfered by a column selection signal line of one of the plurality of column selection signals, to a voltage level of a first data line signal of the pair of second data lines that is not interfered by the column selection signal line so as to compensate for a signal interference.

The enable signal generation step may include a first column selection signal processing step of receiving a first column selection signal, which is enabled before the other column selection signals, of the plurality of enabled column selection signals, delaying the received first column selection signal for a predetermined time, and performing a first exclusive logic OR (XOR) on the delayed first column selection signal and a signal obtained by buffering the first column selection signal to output a first XOR output signal; a second column selection signal processing step of receiving a second column selection signal, which is enabled later than the first column selection signal, of the plurality of enabled column selection signals, delaying the received second column selection signal for a predetermined time, and performing a second logic XOR on the delayed second column selection signal and a signal obtained by buffering the second column selection signal to output a second XOR output signal; a first enable signal generation step of receiving the first XOR output signal and inverting the level of the first XOR output signal to output the first data line enable signal; a second enable signal generation step of receiving the second XOR output signal and inverting the level of the second XOR output signal to output the second data line enable signal; and a signal interference compensation enable signal generation step of receiving the first and second XOR output signals and performing a logic XOR on the first and second XOR output signals to output the signal interference compensation enable signal.

The first column selection signal processing step may include a first buffering step of receiving and buffering the first column selection signal to output a buffered first column selection signal; a first pulse generation step of receiving the enabled first column selection signal, delaying the enabled first column selection signal for a predetermined time, and performing a logic NAND on the delayed signal and the enabled first column selection signal to output a first pulse signal having a predetermined cycle; and a first logic XOR step of receiving the first pulse signal and the buffered first column selection signal and performing a logic XOR on the first pulse signal and the buffered first column selection signal to output the first XOR output signal.

The second column selection signal processing step may include a second buffering step of receiving and buffering the second column selection signal to output a buffered second column selection signal; a second pulse generation step of receiving the enabled second column selection signal, delaying the enabled second column selection signal for a predetermined time, and performing a logic NAND on the delayed signal and the enabled second column selection signal to output a second pulse signal having a predetermined cycle; and a second logic XOR step of receiving the second pulse signal and the buffered second column selection signal and performing a logic XOR on the second pulse signal and the buffered second column selection signal to output the second XOR output signal.

The signal interference compensation step may include a differential amplification step of respectively applying the interfered first data line signal and the uninterfered second data line signal to first and second input terminals and outputting a signal obtained by amplifying a voltage difference between the two input signals from a first or a second output terminal; and a unity gain amplification step of applying the amplified signal to the interfered second data signal line and the first or the second input terminal and maintaining a voltage of the first or the second output terminal constant while repeating the differential amplification step.

BRIEF DESCRIPTION OF THE DRAWINGS

Exemplary embodiments of the present invention will become apparent by reference to the following detailed description taken in conjunction with the accompanying drawings.

DETAILED DESCRIPTION OF THE EXEMPLARY EMBODIMENTS

A semiconductor memory device and a method of compensating for signal interference thereof according to exemplary embodiments of the present invention will be described in detail with reference to the accompanying drawings.

Figure 4:
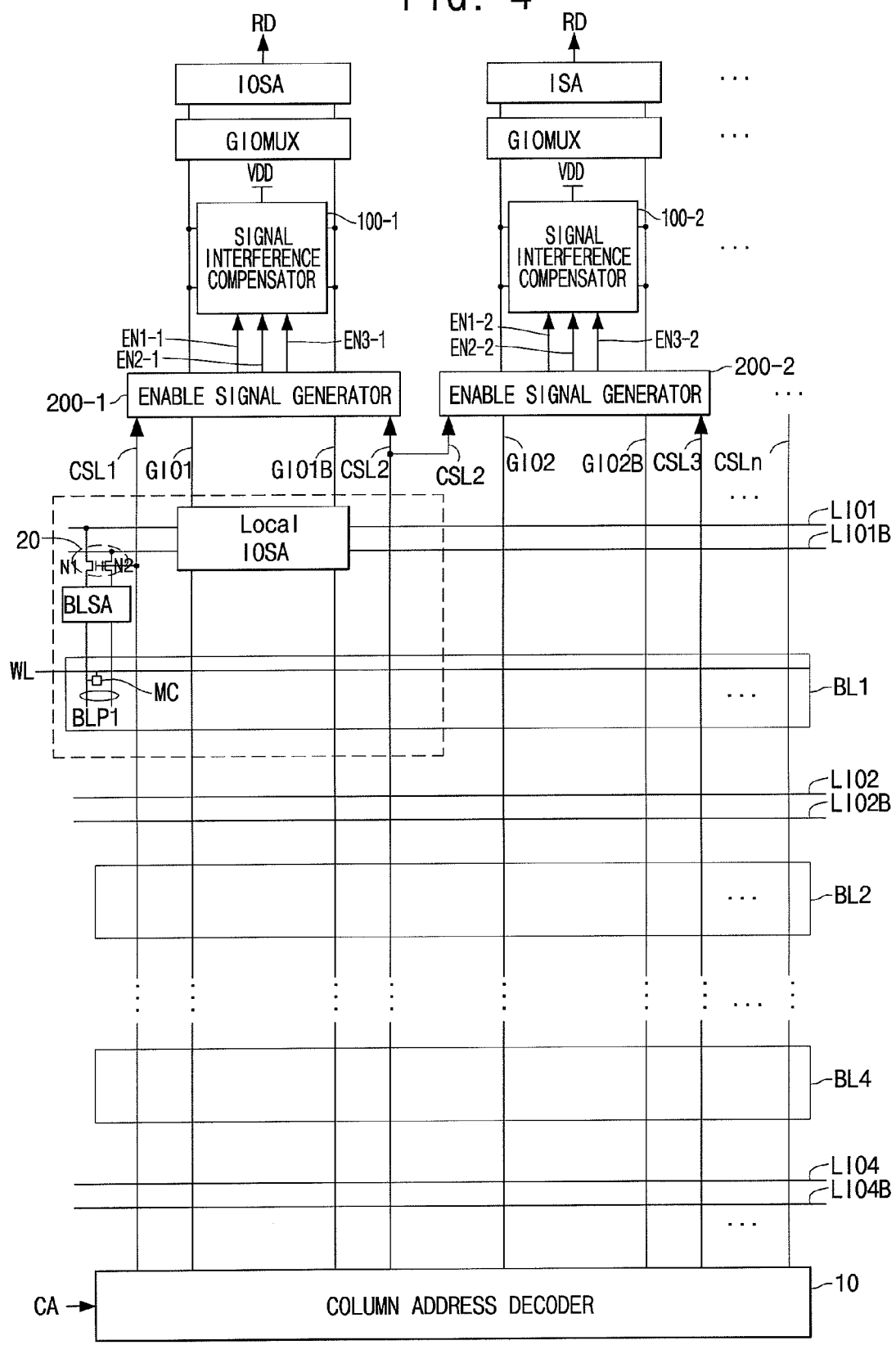
FIG. 4 is a block diagram showing the construction of a semiconductor memory device according to an exemplary embodiment of the present invention.

FIG. 4 is a block diagram of a semiconductor memory device according to an exemplary embodiment of the present invention.

Referring to FIG. 4, the semiconductor memory device includes four memory cell array blocks BL1 to BL4, a plurality of local data input/output lines (LIO1, LIO1B) to (LIO4 to LIO4B), a word line WL, a plurality of column selection signal lines CSL1 to CSLn, a plurality of global data input/output lines (GIO1, GIO1B), (GIO2, GIO2B), . . . , and a column address decoder 10.

An upper left memory array region of the semiconductor memory device including the memory cell array blocks BL1 to BL4, the local data input/output lines (LIO1, LIO1B) to (LIO4, LIO4B), the column selection signal lines CSL1 to CSLn, the global data input/output lines (GIO1, GIOB), (GIO2, GIO2B), . . . , enable signal generators 200-1, 200-2, . . . , and signal interference compensators 100-1, 100-2, . . . will be described. A memory cell MC, a bit line sense amplifier BLSA, and a column selection circuit 20 are connected between the word line WL and a pair of bit lines BLP1. An input/output sensor amplifier IOSA, a global input/output multiplexer GIOMUX, and the signal interference compensator 100-1 are connected between the pair of global data input/output lines GIO1 and GIO1B. Pairs of column selection signal lines CSL1 to CSLn are applied to corresponding enable signal generators 200-1, 200-2, . . . .

As illustrated in from FIG. 4, the word line WL and the plurality of column selection signal lines CSL1 to CSLn are adjacently arranged in the same direction as or in an orthogonal direction to the plurality of local data input/output lines (LIO, LIO1B) to (LIO4, LIO4B), and the plurality of global data input/output lines (GIO1, GIO1B), (GIO2, GIO2B), . . . are arranged in a parallel direction.

Functions of respective blocks of the semiconductor memory device will now be described with reference to FIG. 4.

Figure 1:
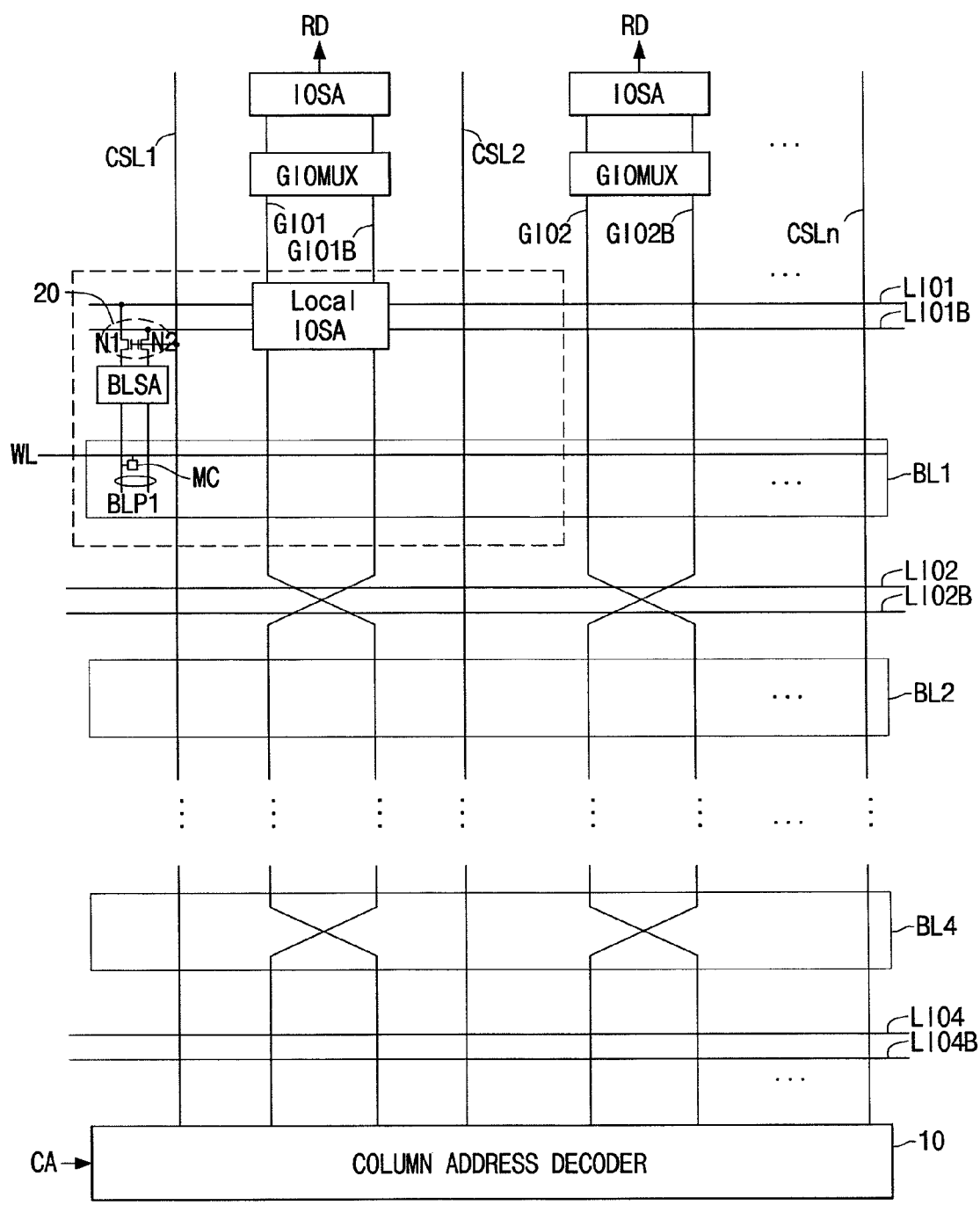
FIG. 1 is a block diagram of a conventional semiconductor memory device using a twisted pair of global data input/output lines.

Functions of the memory cell MC, the bit line sense amplifier BLSA, the column selection circuit 20, the input/output sense amplifier IOSA, the global data input/output multiplexer GIOMUX, and the column address decoder 10 are the same as in the conventional semiconductor memory device of FIG. 1 and thus, a description thereof will be omitted.

The signal interference compensator 100-1 includes a unity gain amplifier. When coupling interference occurs in the global data input/output line GIO1 due to the column selection signal line CSL1, the signal interference compensator 100-1 receives a first input signal from the interfered global data input/output line GIO1, receives a second input signal from the uninterfered global data input/output line bar GIOB1, repeats unity gain amplification of the first and second input signals, and compensates for signal interference induced to the global data input/output line GIO1.

Figure 5:
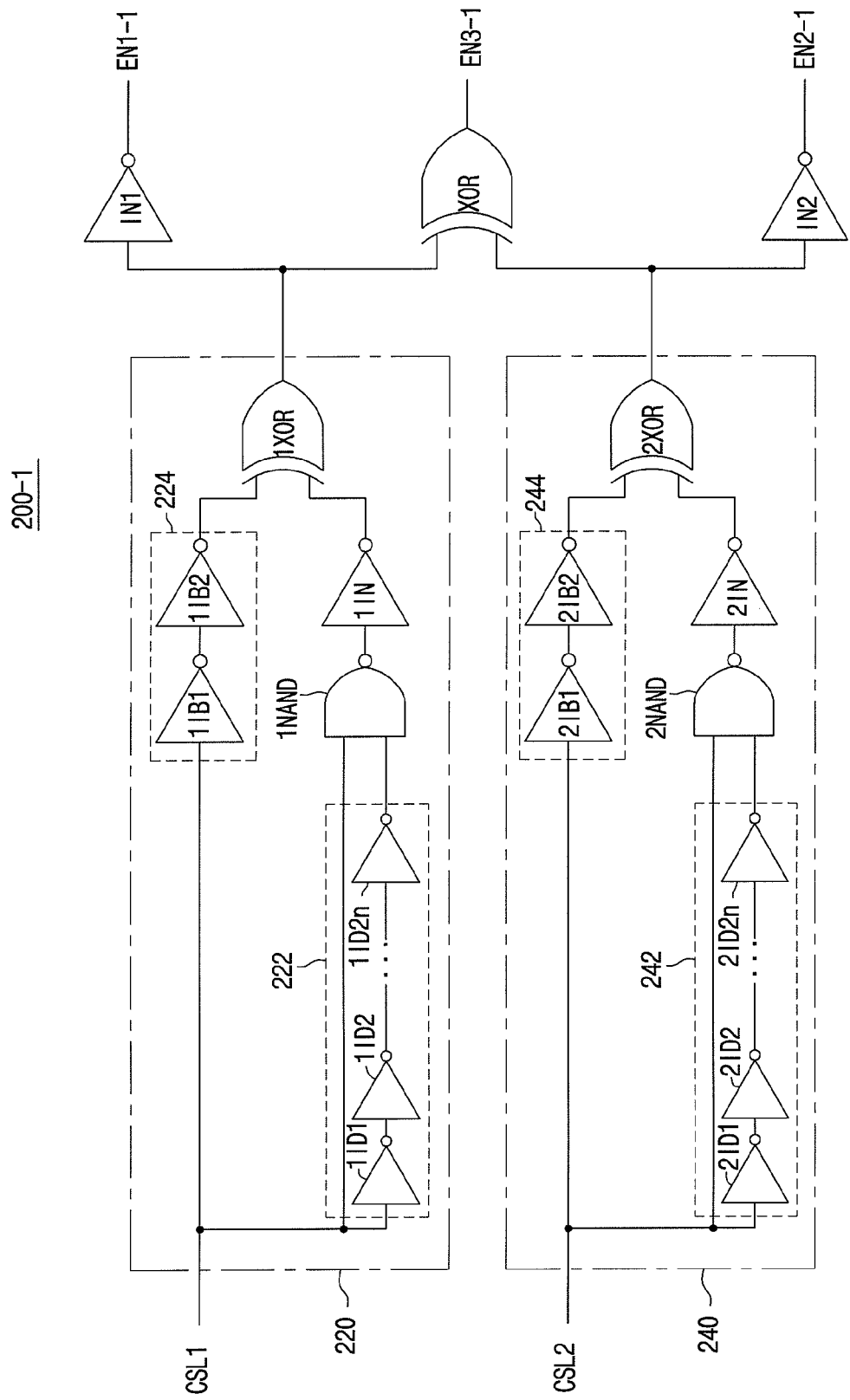
FIG. 5 is a circuit diagram of an enable signal generator 200-1 of the semiconductor memory device shown in FIG. 4.

The enable signal generator 200-1 receives a plurality of column selection signals from the column address decoder 10 and outputs first and second global data input/output line enable signals EN1-1 and EN2-1, and a signal interference compensation enable signal EN3-1 that enables the signal interference compensator 100-1. FIG. 5 is a circuit diagram of the enable signal generator 200-1 of the semiconductor memory device shown in FIG. 4.

Referring to FIG. 5, the enable signal generator 200-1 includes first and second column selection signal processors 220 and 240, second inverters IN1 and IN2, and an XOR gate XOR.

The first column selection signal processor 220 includes a first delay circuit 222, a first buffer 224, a first NAND gate 1NAND, a first inverting portion 1IN, and a first XOR gate 1XOR, and the second column selection signal processor 240 includes a second delay circuit 242, a second buffer 244, a second NAND gate 2NAND, a second inverting portion 2IN, and a second XOR gate 2XOR. The first delay circuit 222 includes an even number of inverters 1ID1 to 1ID2n, and the second delay circuit 242 includes an even number of inverters 21D1 to 21D2n. The first buffer 224 includes two inverters 1IB1 and 1IB2, and the second buffer 244 includes two inverters 2IB1 and 2IB2.

Operation of the enable signal generator 200-1 of the semiconductor memory device will now be described with reference to FIG. 5.

Initially, since only one of the plurality of column selection signals is enabled in the column address decoder 10, a period where a first column selection signal CSL1 is enabled to a high level does not overlap with a period where a second column selection signal CSL2 is enabled to a high level.

When the first column selection signal CSL1 is enabled to a high level and applied to the first column selection signal processor 220, the first delay circuit 222 receives the first column selection signal CSL1, delays the first column selection signal CSL1 for a predetermined time, and outputs the delayed signal. The first NAND gate 1NAND receives the first column selection signal CSL1 and the delayed first column selection signal CSL1, performs a logic NAND on the two received signals, and outputs a low-level NAND output signal only when the two received signals are at a high level.

Also, the first inverting portion 1IN receives a NAND output signal from the first NAND gate 1NAND, inverts the level of the NAND output signal, and outputs the level-inverted signal. The first buffer 224 receives the high-level first column selection signal CSL1, delays the first column selection signal CSL1 for a predetermined time, and outputs the delayed signal.

The first XOR gate 1XOR receives the high-level first column selection signal CSL1 from the first buffer 224, receives the inverted signal from the first inverting portion 1IN, and performs a logic XOR on the two received signals. When the first column selection signal CSL1 is at the same level as the inverted signal, the first XOR gate 1XOR outputs a low-level XOR output signal. When the first column selection signal CSL1 is at a different level from the inverted signal, the first XOR gate 1XOR outputs a high-level XOR output signal. The inverter INI receives the XOR output signal from the first XOR gate 1XOR, inverts the received XOR output signal, and outputs the first global data input/output line enable signal EN1-1.

Since the second column selection signal CSL2 is not currently enabled, when the column selection signal CSL2 is applied at a low level to the second column selection signal processor 240, the second delay circuit 242 receives the low-level column selection signal CSL2, delays the received signal for a predetermined time, and outputs the delayed signal. The second NAND gate 2NAND receives the second column selection signal CSL2 and the delayed second column selection signal CSL2, performs a logic NAND on the two received signals, and outputs a low-level NAND output signal only when the two received signals are at a high level.

Also, the second inverting portion 2IN receives an NAND output signal from the second NAND gate 2NAND, inverts the level of the NAND output signal, and outputs the level-inverted signal. The second buffer 244 receives the low-level second column selection signal CSL2, delays the second column selection signal CSL2 for a predetermined time, and outputs the delayed signal.

The second XOR gate 2XOR receives the low-level second column selection signal CSL2 from the second buffer 244, receives the inverted signal from the second inverting portion 2IN, and performs a logic XOR on the two received signals. When the second column selection signal CSL2 is at the same level as the inverted signal, the second XOR gate 2XOR outputs a low-level XOR output signal. When the second column selection signal CSL2 is at a different level from the inverted signal, the second XOR gate 2XOR outputs a high-level XOR output signal. The second inverter IN2 receives the XOR output signal from the second XOR gate 2XOR, inverts the XOR output signal, and outputs a second global data input/output line enable signal EN2-1.

Also, the XOR gate XOR receives the output signal of the first XOR gate 1XOR and the output signal of the second XOR gate 2XOR and performs a logic XOR on the two received signals. Thus, the XOR gate XOR outputs a low-level XOR output signal when the two received signals are at the same level, and outputs a high-level signal interference compensation enable signal EN3-1 when the two received signals are at different levels.

Similarly, when the second column selection signal CSL2 is enabled in the column address decoder 10 and makes a low-to-high transition, the first and second column selection signal processors 220 and 240, the second inverters IN1 and IN2, and the XOR gate XOR perform the same operations as in the enabling period of the first column selection signal CSL1 and output the first and second global data input/output line enable signals EN1-1 and EN2-1, and the signal interference compensation signal EN3-1 as shown in FIG. 5.

Figure 6:
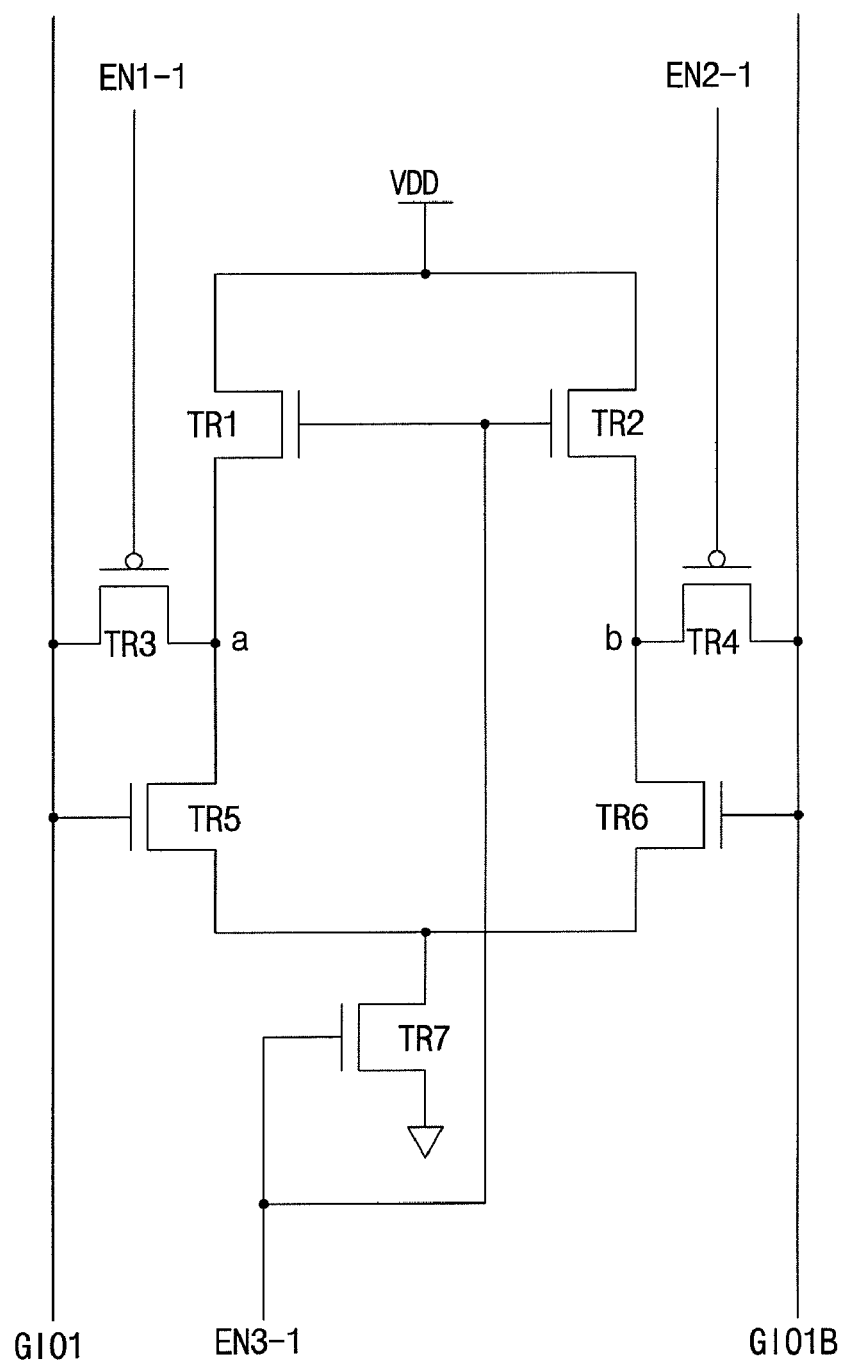
FIG. 6 is a circuit diagram of a signal interference compensator of the semiconductor memory device shown in FIG. 4.

FIG. 6 is a circuit diagram of the signal interference compensator 100-1 shown in FIG. 4.

Referring to FIG. 6, the signal interference compensator 100-1 includes first through seventh transistors TR1 to TR7. In the signal interference compensator 100-1, the first and second transistors TR1 and TR2 are respectively connected in parallel and each have one terminal to which a power supply voltage VDD is applied, and gate terminals to which the signal interference compensation enable signal EN3-1 is applied. The third and fourth transistors TR3 and TR4 each have one terminal respectively connected to the other terminals of the first and second transistors TR1 and TR2, gate terminals to which signals output from the pair of global data input/output lines GIO1 and GIO1B are respectively applied, and the other terminals respectively connected to the pair of global data input/output lines GIO1 and GIO1B. The fifth and sixth transistors TR5 and TR6 each have one terminal respectively connected to the other terminals of the first and second transistors TR1 and TR2 and gate terminals respectively connected to the pair of global data input/output lines GIO1 and GIO1B. The seventh transistor TR7 has one terminal connected to the other terminals of the fifth and sixth transistors TR5 and TR6, a gate terminal to which the signal interference compensation enable signal EN3-1 is applied, and the other terminal that is grounded.

In this case, the signal interference compensator 100-1 is a unity gain amplifier in which an output signal from a first output node "a" that is a contact point between the first and third transistors TR1 and TR3 or a second output node "b" that is a contact point between the second and fourth transistors TR2 and TR4 is applied again to the gate terminal of the fifth transistor TR5 or the sixth transistor TR6 in response to the first and second global data input/output line enable signals EN1-1 and EN2-1. Also, each of the transistors TR1 to TR7 may function as a switch in response to the signal interference compensation enable signal EN3-1 and be embodied by a PMOS transistor or an NMOS transistor.

The operation of the enable signal generator 200-1 of the semiconductor memory device will now be described with reference to FIG. 6.

When the first column selection signal CSL1 is enabled in the column address decoder 10, the enable signal generator 200-1 generates a high-level signal interference compensation enable signal EN3-1, the first global data input/output line enable signal EN1-1 is disabled to a low level and applied to the enable signal generator 200-1, and the second global data input/output line enable signal EN2-1 is enabled to a high level and applied to the enable signal generator 200-1.

Thus, the third transistor TR3 is turned on and the fourth transistor TR4 is turned off so that the enable signal generator 200-1 is a unity gain amplifier in which an output signal of the first output node "a" is applied again to the gate terminal of the fifth transistor TR5.

When a global data input/output line signal GIO1 that is interfered with by the first column selection signal line CSL1 is applied to the gate terminal (or a first input terminal) of the transistor TR5 and an uninterfered global data input/output line bar signal GIO1B is applied to the gate terminal (or a second input terminal) of the transistor TR6, the fifth and sixth transistors TR5 and TR6 perform a differential amplification operation so that a signal obtained by amplifying a voltage difference between the two input signals is output from the first output node "a".

Since the amplified signal is fed back to the global data input/output line GIO1 connected to the first output node "a" and applied again to the gate terminal (the first input terminal) of the transistor TR5 at the same time, the above-described differential amplification operation is repeated to enable a unity gain amplification operation, so that the first output node "a" is maintained at a constant voltage level.

Thus, even if the global data input/output line GIO1 connected to the first output node "a" is interfered with by the first column selection signal line CSL1, the global data input/output line GIO1 is adaptively maintained at a constant voltage level according to a second input signal applied to the transistor TR6 connected to the uninterfered global data input/output bar line GIO1B and shifted to a voltage level of an uninterfered signal, thereby compensating for interference induced to the interfered global data input/output line GIO1.

Similarly, assuming that the second column selection signal CSL2 out of a plurality of column selection signals is enabled in the column address decoder 10, the enable signal generator 200-1 generates a high-level signal interference compensation enable signal EN3-1, the first global data input/output line enable signal is enabled to a high level and applied to the enable signal generator 200-1, and the second global data input/output line enable signal is disabled to a low level and applied to the enable signal generator 200-1.

Thus, the third transistor TR3 is turned off and the fourth transistor TR4 is turned on so that the enable signal generator 200-1 functions as a unity gain amplifier in which an output signal output from the second output node "b" is applied again to the gate terminal of the sixth transistor TR6.

When a global data input/output line bar GIO1B signal that is interfered with by the second column selection signal line CSL2 is applied to the gate terminal (the second input terminal) of the transistor TR6, and the uninterfered global data input/output line GIO1 signal is applied to the gate terminal (the first input terminal) of the transistor TR5, the fifth and sixth transistors TR5 and TR6 perform a differential amplification operation so that a signal obtained by amplifying a voltage difference between the two input signals is output from the second output node "b".

Since the amplified signal is fed back to the global data input/output line bar GIO1B connected to the second output node "b" and applied again to the gate terminal (the second input terminal) of the transistor TR6 at the same time, the above-described differential amplification operation is repeated to enable a unity gain amplification operation, so that the second output node "b" is maintained at a constant voltage level.

Figure 7:
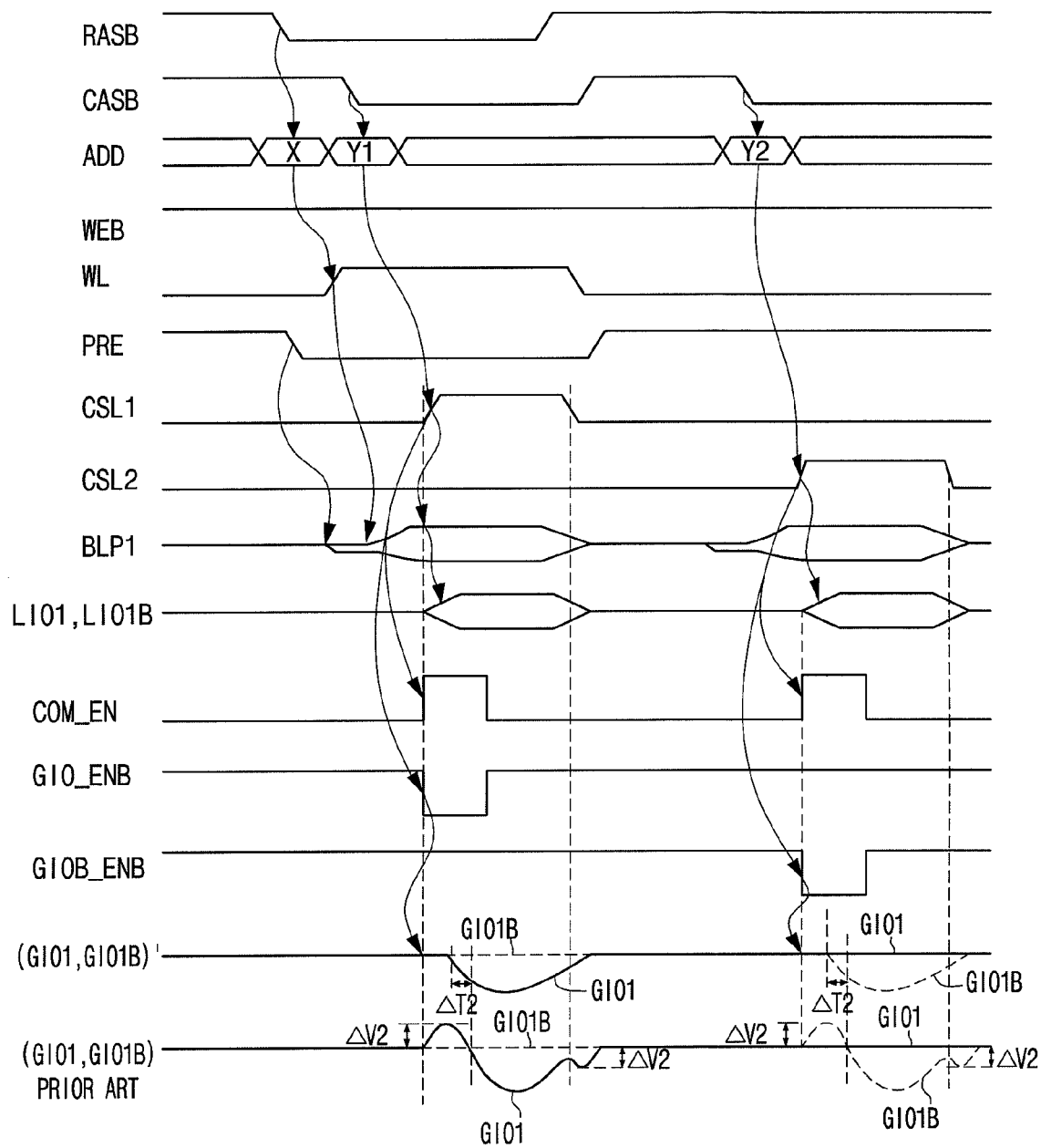
FIG. 7 is a timing diagram illustrating the operation of a memory cell array block BL1 of the semiconductor memory device shown in FIG. 4.

FIG. 7 is a timing diagram illustrating the operation of the memory cell array block BL1 of the semiconductor memory device shown in FIG. 4.

The operation of the memory cell array block BL1 is affected by the input and output of a row address strobe signal RASB, a column address strobe signal CASB, an address signal ADD, a write enable signal WEB, a word line enable signal WL, a precharge signal PRE, a first column selection signal CSL1, a second column selection signal CSL2, a pair of bit line signals BLP1, a pair of local data input/output line signals LIO1 and LIO1B, a first global data input/output line enable signal EN1-1, a second global data input/output line enable signal EN2-1, a signal interference compensation enable signal EN3-1, and a pair of global data input/output line signals GIO1 and GIO1B.

Figure 2:
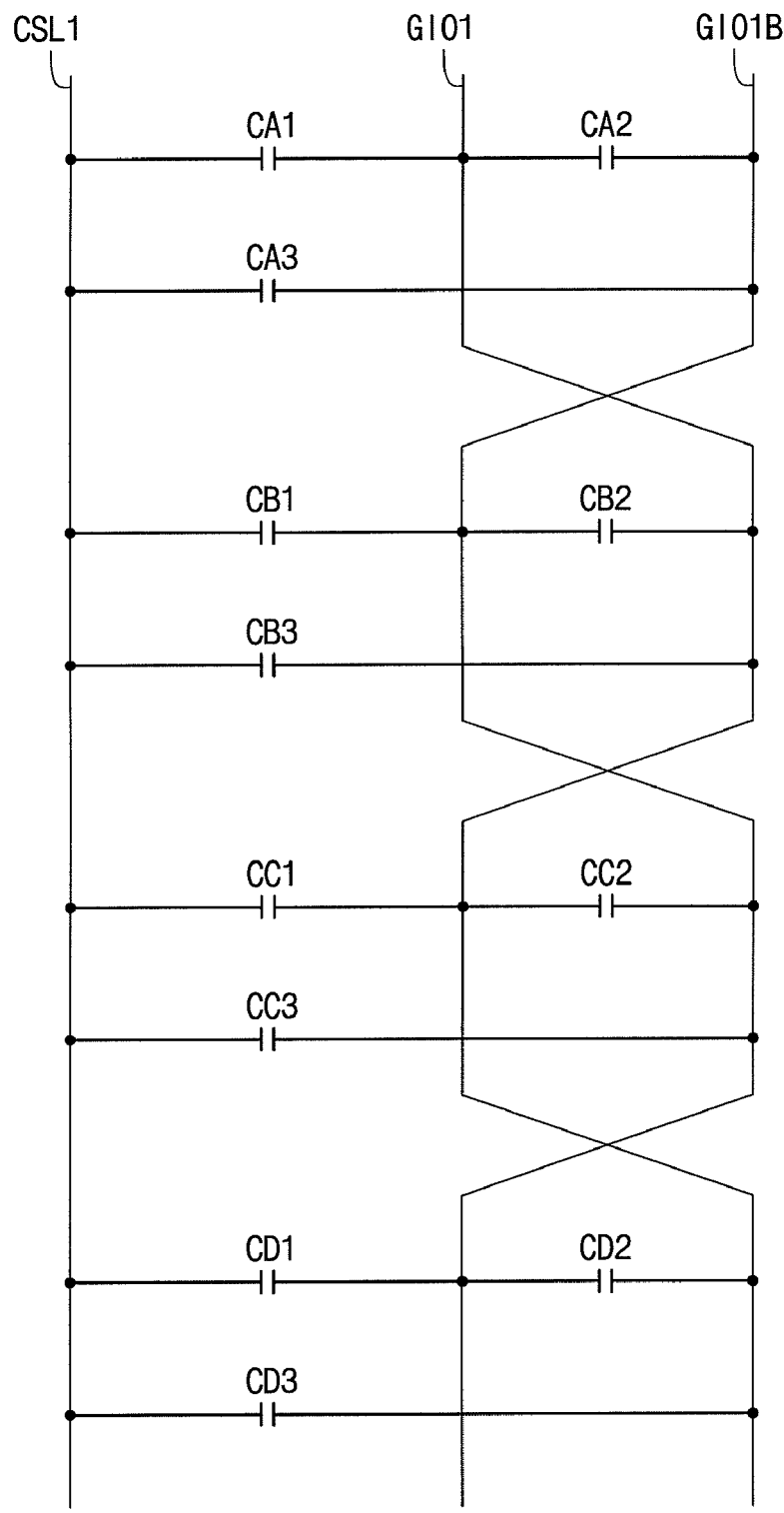
FIG. 2 is a circuit diagram for modeling coupling capacitance between a column selection signal line and a twisted pair of global data input/output lines in the conventional semiconductor memory device shown in FIG. 1.
Figure 3:
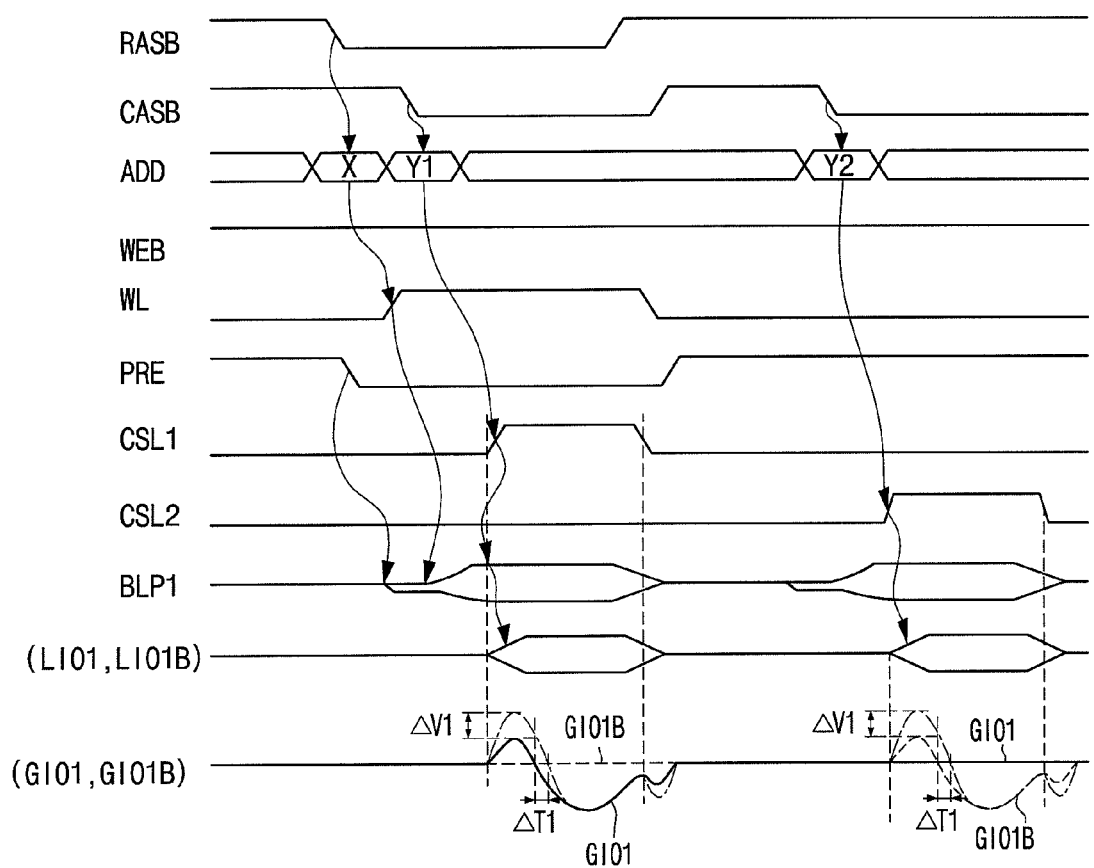
FIG. 3 is a timing diagram illustrating the operation of a memory cell array block BL1 of the conventional semiconductor memory device shown in FIG. 1.

As in FIG. 3, it is assumed that a high-level inverted write enable signal WEB is applied to read low-level data from the pair of bit lines BLP1. In this case, a low-level row address strobe signal RASB and a low-level column address strobe signal CASB are applied to input a row address X and column addresses Y1 and Y2 as an address signal ADD, the row address X and the column addresses Y1 and Y2 are decoded to generate a high-level word line enable signal WL and first and second column selection signals CSL1 and CSL2, a voltage difference between data signals transmitted to a pair of bit line signals BLP1 develops in response to the high-level word line enable signal WL so that the bit line sense amplifier BLSA amplifies the voltage difference between the data signals transmitted to the pair of bit lines BLP1 to a complementary level, and the data signals of the pair of bit lines BLP1 are respectively transmitted to a pair of local data input/output lines LIO1 and LIO1B and a pair of global data input/output lines GIO1 and GIO1B in response to the high-level first and second column selection signals CSL1 and CSL2 and amplified by the input/output sense amplifier IOSA, in the same manner as described above with reference to FIGS. 1 through 3.

However, unlike in the conventional memory cell array block BL1, when the first column selection signal CSL1 is enabled to a high level in a column address decoder 10, an enable signal generator 200 outputs a low-level first global data input/output line enable signal EN1-1, a high-level second global data input/output line enable signal EN2-1, and a high-level signal interference compensation enable signal EN3-1. Also, when the second column selection signal CSL2 is enabled to a high level in the column address decoder 10, the enable signal generator 200 outputs a high-level first global data input/output line enable signal EN1-1, a low-level second global data input/output line enable signal EN2-1, and a high-level signal interference compensation enable signal EN3-1.

In addition, unlike in the conventional memory cell array block BL1, the signal interference compensator 100-1 repeats a unity gain amplification operation in response to the enable signals EN1-1, EN2-1, and EN3-1 of the enable signal generator 200, so that voltage levels of signals of global data input/output lines (GIO1, GIO1B) and (GIO1, GIO1B)' remain constant unlike the conventional memory cell array block BL1 in which voltage levels of the signals GIO1 and GIO1B are instantaneously elevated or lowered by ΔV2.

Accordingly, when the input/output sense amplifier IOSA starts to sense and amplify a voltage difference between data signals transmitted to the pair of global data input/output lines GIO1 and GIO1B, i.e., when the voltage difference between the data signals transmitted to the pair of global data input/output lines GIO1 and GIO1B is produced, is earlier by ΔT2 than in the conventional memory cell array block BL1.

That is, voltage levels of signals of the pair of global data input/output lines GIO1 and GIO1B of the memory cell array block BL1 according to an exemplary embodiment the present invention are not changed by ΔV2, as in the conventional memory cell array blocks BL1, but are maintained constant. Thus, a time ΔT2 required for producing a voltage difference between data signals transmitted to the pair of global data input/output lines GIO1 and GIO1B of the conventional memory cell array block BL1 can be eliminated, thereby accelerating a read data access time.

The operation of the memory cell array block BL1 of the semiconductor memory device according to an exemplary embodiment of the present invention will now be described with reference to FIGS. 4 through 7.

Initially, it is assumed that low-level data is read from the pair of bit lines BLP1 to the memory cell MC.

An upper left memory array region of the semiconductor memory device including the memory cell array blocks BL1 to BL4, the local data input/output lines (LIO1, LIO1B) to (LIO4, LIO4B), the column selection signal lines CSL1 to CSLn, and the global data input/output lines (GIO1, GIO1B), (GIO2, GIO2B), . . . will be described.

Referring to FIG. 7, when a low-level row address strobe signal RASB is externally applied, the address signal ADD loads the row address X. When a low-level column address strobe signal CASB is externally applied, the address signal ADD loads the column address Y1.

A row address decoder decodes the row address X and generates a high-level word line enable signal WL, and the column address decoder 10 decodes the column address Y1 and generates a high-level column selection signal CSL1.

Meanwhile, when a high-level precharge signal PRE is generated before the high-level word line enable signal WL, the pair of bit lines BLP1, the pair of local data input/output lines LIO1 and LIO1B, and the pair of global data input/output lines GIO1 and GIO1B are precharged in response to the high-level precharge signal PRE.

When the high-level word line enable signal WL is generated, a voltage difference between data signals transmitted to the pair of bit lines BLP1 is produced, and the bit line sense amplifier BLSA amplifies the voltage difference between the data signals transmitted to the pair of bit lines BLP1 to a complementary level.

Also, after the row address X and the column address Y1 are decoded, when the high-level column selection signal CSL1 is generated to read data written in the memory cell MC, the data signals of the pair of bit lines BLP1 are respectively transmitted to the pair of local data input/output lines LIO1 and LIO1B and then transmitted to the pair of global data input/output lines GIO1 and GIO1B.

In this case, since a signal is applied to only one of a plurality of column selection signal lines CSL1 to CSLn, coupling interference occurs in only a global data input/output line GIO that is closest to the column selection signal line CSL1, so that the column selection signal line CSL1 fully swings from a power supply voltage to a ground voltage. As a result, it interferes with the small-swing global data input/output line GIO.

At this time, the signal interference compensator 100-1 including the unity gain amplifier repeats a unity gain amplification operation. Thus, a signal of the interfered global data input/output line GIO1 is compared with a signal of the uninterfered global data input/output line bar GIO1B, so that a voltage of the signal of the interfered global data input/output line GIO1 is adaptively shifted to a voltage of the signal of the uninterfered global data input/output line bar GIO1B, thereby compensating for signal interference induced to the global data input/output line GIO1.

In other words, when the first column selection signal CSL1 out of a plurality of column selection signals CSL1 to CSLn is enabled in the column address decoder 10, the enable signal generator 200-1 generates a high-level signal interference compensation enable signal EN3-1, the first global data input/output line enable signals EN1-1 are disabled to a low level and applied to the enable signal generator 200-1, and a second global data input/output line enable signal EN2-1 is enabled to a high level and applied to the enable signal generator 200-1.

Thus, the third transistor TR3 is turned on and the fourth transistor TR4 is turned off, so that the enable signal generator 200-1 functions as the unity gain amplifier in which an output signal output from the first output node "a" is applied again to the gate terminal of the fifth transistor TR5.

Accordingly, referring to FIG. 6, when the global data input/output line GIO1 signal that is interfered with by the first column selection signal line CSL1 is applied to the gate terminal (the first input terminal) of the transistor TR5, and the global data input/output line bar GIO1B signal that is not interfered with by the first column selection signal line CSL1 is applied to the gate terminal (the second input terminal) of the transistor TR6, the fifth and sixth transistors TR5 and TR6 perform a differential amplification operation so that a signal obtained by amplifying a voltage difference between the two input signals is output from the first output node "a".

Since the amplified signal is fed back to the global data input/output line GIO1 connected to the first output node "a" and applied again to the gate terminal (the first input terminal) of the transistor TR5 at the same time, the above-described differential amplification operation is repeated to enable a unity gain amplification operation, so that the first output node "a" is maintained at a constant voltage level.

Accordingly, even when the global data input/output line GIO1 connected to the first output node "a" is interfered with by the first column selection signal line CSL1, the global data input/output line GIO1 is adaptively maintained at a constant voltage level according to a second input signal applied to the transistor TR6 connected to the uninterfered global data input/output bar line GIOB and shifted to a voltage level of an uninterfered signal, thereby compensating for the interference induced to the interfered global data input/output line GIO1.

In this case, the signal interference compensation enable signal EN3-1 applied to the gate terminals of the transistors TR1, TR2, and TR7 of the signal interference compensator 100-1, which may turn on or off the signal interference compensator 100-1, varies with a signal of the column selection signal line CSL1 disposed adjacent to the global data input/output line GIO1 when data read from the memory cell MC is applied as a second input signal.

Specifically, when a signal of the column selection signal line CSL1 is enabled to a high level, the signal interference compensation enable signal EN3-1 is enabled to a high level to turn on the transistors TR1, TR2, and TR7 of the signal interference compensator 100-1. Also, before data read from the memory cell MC is transmitted through the uninterfered global data input/output line bar GIO1B and applied as the second input signal to the signal interference compensator 100-1, the signal interference compensation enable signal EN3-1 is disabled to a low level to turn off the signal interference compensator 100-1.

Before data read from the memory cell MC is input as the second input signal, the pair of global data input/output line signals GIO1 and GIO1B have the same polarity. However, after the data read from the memory cell MC is input as the second input signal, the pair of global data input/output line signals GIO1 and GIO1B are restored to their original opposite polarities because when signal interference occurs due to the column selection signal line CSL1, the global data input/output line signal GIO1 cannot have the same polarity as the global data input/output line bar signal GIO1B.

Accordingly, the enable signal generator 200-1 is set to enable the signal interference compensation enable signal EN3-1 only before read data is applied as the second input signal to the signal interference compensator 100-1, and disable the signal interference compensation enable signal EN3-1 after the read data is applied as the second input signal through the global data input/output line bar GIO1B that is restored to its original polarity opposite to the polarity of the global data input/output line GIO1, and outputs the signal interference compensation enable signal EN3-1.

Similarly, after a predetermined time has elapsed, when the column address strobe signal CASB is disabled to a low level again and the address signal ADD loads the column address Y2, the column address decoder 10 decodes the column address Y2 and generates a high-level second column selection signal CSL2.

Thus, a voltage difference between data signals transmitted to the pair of bit line signals BLP1 develops so that the bit line sense amplifier BLSA amplifies the voltage difference of the data signals transmitted to the pair of bit lines BLP1 to a complementary level, and the data signals of the pair of bit lines BLP1 are respectively transmitted to the pair of local data input/output lines LIO1 and LIO1B and the pair of global data input/output lines GIO1 and GIO1B and amplified by the input/output sense amplifier IOSA, in the same manner as when the first column selection signal CSL1 is enabled to a high level.

When the second column selection signal CSL2 is enabled in the column address decoder 10, the enable signal generator 200-1 generates the high-level signal interference compensation enable signal EN3-1, the first global data input/output line enable signal EN1-1 is enabled to a high level and applied to the enable signal generator 200-1, and the second global data input/output line enable signal EN2-1 is disabled to a low level and applied to the enable signal generator 200-1.

Thus, the third transistor TR3 is turned off and the fourth transistor TR4 is turned on so that the enable signal generator 200-1 functions as the unity gain amplifier in which an output signal output from the second output node "b" is applied again to a gate terminal of the sixth transistor TR6. As a result, when the global data input/output line bar signal GIO1B that is interfered with by the second column selection signal line CSL2 is applied to the gate terminal (i.e., a second input terminal) of the sixth transistor TR6, and the uninterfered global data input/output line signal GIO1 is applied to the gate terminal (i.e., a first input terminal) of the fifth transistor TR5, the fifth and sixth transistors TR5 and TR6 perform a differential amplification operation so that a signal obtained by amplifying a voltage difference between the two input signals is output from the second output node "b".

Since the amplified signal is fed back to the global data input/output line bar GIO1B connected to the second output node "b" and applied again to the gate terminal (the second input terminal) of the sixth transistor TR6 at the same time, the above-described differential amplification operation is repeated to enable a unity gain amplification operation, so that the second output node "b" is maintained at a constant voltage level.

Accordingly, as shown in FIG. 7, since the global data input/output line bar signal GIO1B is interfered with by the second column selection signal CSL2, the phases of the pair of global data input/output line signals GIO1 and GIO1B are opposite to the phases of the pair of global data input/output line signals GIO1 and GIO1B generated when the global data input/output line signal GIO1 is interfered with by the first column selection signal CSL1. Also, voltage levels of the signals of the pair of global data input/output lines GIO1 and GIOB of the memory cell array block BL1 according to an exemplary embodiment of the present invention are not changed by $\Delta V2$ as in the conventional memory cell array blocks BL1 but are maintained constant. Thus, a time $\Delta T2$ required for producing a voltage difference between data signals transmitted to the pair of global data input/output lines GIO1 and GIO1B of the conventional memory cell array block BL1 can be eliminated, thereby accelerating a read data access time.

Therefore, when the input/output sense amplifier IOSA senses and amplifies a voltage difference between the data signals transmitted to the pair of global data input/output lines GIO1 and GIO1B is earlier by $\Delta T2$ than in the conventional memory cell array block BL1, a read data access time is accelerated. When a simulation was conducted according to an exemplary embodiment of the present invention, a 40-mV interference signal was compensated for and a read time was reduced by about 700 ps.

As described above, a semiconductor memory device according to an exemplary embodiment of the present invention does not need a twisted pair of global data input/output lines to avoid the degradation of a data read speed due to signal interference of a column selection signal line CSL disposed adjacent to the pair of global data input/output lines GIO1 and GIOB. Thus, layers of the pair of global data input/output lines GIO1 and GIOB need not be changed, and corresponding contacts (e.g., vias) need not be provided. Therefore, distortion of the pair of global data input/output lines GIO and GIOB or a delay in a transmission signal due to an extra via can be avoided, and it is unnecessary to reverse data encoding at portions where the pair of global data input/output lines GIO1 and GIOB are twisted.

Furthermore, interference between a data signal line and an address signal line that are disposed adjacent to each other is adaptively compensated, thereby improving a data read speed of a semiconductor memory device.

Although exemplary embodiments of the present invention have been described for illustrative purposes, those skilled in the art will appreciate that various modifications, additions and substitutions are possible, without departing from the scope and spirit of the disclosure.

What is claimed is:
1. A semiconductor memory device, comprising:
 a memory cell array including a plurality of memory cell array blocks;
 a plurality of pairs of first data lines for transceiving data with corresponding memory cell array blocks of the memory cell array blocks;
 a plurality of column selection signal lines disposed in an orthogonal direction to the pairs of first data lines; and
 a plurality of pairs of second data lines disposed adjacent and parallel to the column selection signal lines to transceive data with corresponding pairs of first data lines of the pairs of first data lines, wherein the memory cell array includes a signal interference compensator that shifts a voltage level of a second data line signal of one of the pairs of second data lines disposed adjacent to one of the plurality of column selection signal lines, to a voltage level of a first data line signal of the pair of second data lines.

2. The device according to claim 1, wherein each of the plurality of memory cell array blocks comprises:
   a plurality of pairs of bit lines disposed parallel to the plurality of pairs of second data lines;
   a word line disposed in an orthogonal direction to the plurality of pairs of bit lines;
   a plurality of memory cells, each memory cell having a first terminal connected to one of a corresponding pair of bit lines and a second terminal connected to the word line to output read data to the corresponding pair of bit lines; and
   an address selection circuit for receiving a pair of amplified bit line signals and for transmitting the pair of amplified bit line signals to a corresponding pair of first data lines.

3. The device according to claim 1, further comprising:
   an address decoder for receiving an external address and decoding the external address to enable one of a plurality of column selection signals;
   a data input/output multiplexer for receiving an output signal from the signal interference compensator and converting N-bit parallel data of the pair of second data lines into M serial data to output converted data; and
   an input/output sense amplifier for receiving the M serial data and amplifying a voltage level of the serial data to output amplified serial data.

4. The device according to claim 1, further comprising an enable signal generator for outputting a signal interference compensation enable signal and first and second data line enable signals in response to first and second column selection signals, which are sequentially enabled out of the plurality of column selection signals, to enable the signal interference compensator before read data is transmitted to the signal interference compensator.

5. The device according to claim 4, wherein the signal interference compensator receives the second data line signal and the first data line signal via first and second input terminals, respectively, and generates a signal obtained by amplifying a voltage difference between the first and second input terminals via a first or a second output terminal using a differential amplification operation, and
   the signal interference compensator applies the amplified signal to the second data line and the first or the second input terminal and performs unity gain amplification while repeating the differential amplification operation to maintain a voltage of the first or the second output terminal constant.

6. The device according to claim 5, wherein the signal interference compensator comprises:
   a differential amplifier for receiving the second data line signal via the first input terminal, receiving the first data line signal via the second input terminal, and amplifying the voltage difference between the two received signals to output the amplified signal; and
   first and second transistors having first terminals respectively connected to the first and second output terminals of the differential amplifier, gate terminals to which the first and second data line enable signals are respectively applied, and second terminals respectively connected to the first and second data lines.

7. The device according to claim 6, wherein the differential amplifier is a unity gain amplifier that receives an output signal output from the first or second output terminals of the differential amplifier via the first or the second input terminal in response to each of the first and second data line enable signals.

8. The device according to claim 6, wherein the first and second transistors are PMOS transistors or NMOS transistors that control the enabling of the signal interference compensator.

9. The device according to claim 4, wherein the enable signal generator comprises:
   a first column selection signal processor for receiving the enabled first column selection signal, delaying the enabled first column selection signal for a predetermined time, and performing a first logic exclusive OR (XOR) on the delayed enabled first column selection signal and a signal obtained by buffering the enabled first column selection signal to output a first XOR output signal;
   a second column selection signal processor for receiving the enabled second column selection signal, delaying the enabled second column selection signal for a predetermined time, and performing a second logic XOR on the delayed enabled second column selection signal and a signal obtained by buffering the enabled second column selection signal to output a second XOR output signal;
   a first inverter for receiving the first XOR output signal and inverting the level of the first XOR output signal to output the first data line enable signal;
   a second inverter for receiving the second XOR output signal and inverting the level of the second XOR output signal to output the second data line enable signal; and
   an XOR gate for receiving the first and second XOR output signals and performing a logic XOR on the first and second XOR output signals to output the signal interference compensation enable signal.

10. The device according to claim 9, wherein the first column selection signal processor comprises:
    a first buffer for receiving and buffering the enabled first column selection signal to output the buffered signal;
    a first pulse generator for receiving the enabled first column selection signal, delaying the enabled first column selection signal for a predetermined time, and performing a logic NAND on the delayed signal and the enabled first column selection signal to output a first pulse signal having a predetermined cycle; and
    a first XOR gate for receiving the buffered first column selection signal and the first pulse signal and performing a logic XOR on the buffered first column selection signal and the first pulse signal to output the first XOR output signal.

11. The device according to claim 10, wherein the first pulse generator comprises:
    a first delay circuit for receiving the enabled first column selection signal and delaying the enabled first column selection signal for a predetermined time to output the delayed signal;
    a first NAND gate for receiving the enabled first column selection signal and the delayed first column selection signal and performing the logic NAND on the enabled first column selection signal and the delayed first column selection signal to output a first NAND output signal; and
    a first inverting portion for receiving the first NAND output signal and inverting the level of the first NAND output signal to output the first pulse signal.

12. The device according to claim 11, wherein the first delay circuit includes a plurality of serially connected inverters, each inverter having an input terminal to which the enabled first column selection signal is applied and an output terminal connected to the first NAND gate.

13. The device according to claim 12, wherein the second column selection signal processor comprises:
  a second buffer for receiving and buffering the enabled second column selection signal to output the buffered signal;
  a second pulse generator for receiving the enabled second column selection signal, delaying the enabled second column selection signal for a predetermined time, and performing a logic NAND on the delayed signal and the enabled second column selection signal to output a second pulse signal having a predetermined cycle; and
  a second XOR gate for receiving the second pulse signal and the buffered second column selection signal and performing a logic XOR on the second pulse signal and the buffered first column selection signal to output the second XOR output signal.

14. The device according to claim 13, wherein the second pulse generator comprises:
  a second delay circuit for receiving the enabled second column selection signal and delaying the enabled second column selection signal for a predetermined time to output the delayed signal;
  a second NAND gate for receiving the enabled second column selection signal and the delayed second column selection signal and performing the logic NAND on the enabled second column selection signal and the delayed second column selection signal to output a second NAND output signal; and
  a second inverting portion for receiving the second NAND output signal and inverting the level of the second NAND output signal to output the second pulse signal.

15. The device according to claim 14, wherein the second delay circuit includes a plurality of serially connected inverters, each inverter having an input terminal to which the enabled second column selection signal is applied and an output terminal connected to the second NAND gate.

16. A method of compensating for signal interference of a semiconductor memory device comprising a plurality of memory cell array blocks, a plurality of pairs of first data lines disposed to respectively correspond to the memory cell array blocks, a plurality of column selection signal lines disposed in an orthogonal direction to the pairs of first data lines, and a plurality of pairs of second data lines disposed adjacent and parallel to the column selection signal lines, the method comprising:
  an address decoding step of receiving an external address and decoding the external address to sequentially enable a plurality of column selection signals;
  an enable signal generation step of outputting a signal interference compensation enable signal and first and second data line enable signals in response to the sequentially enabled column selection signals; and
  a signal interference compensation step of shifting a voltage level of a second data line signal of one of the pairs of second data lines disposed adjacent to a column selection signal line of one of the plurality of column selection signals, to a voltage level of a first data line signal of the pair of second data lines.

17. The method according to claim 16, wherein the enable signal generation step comprises:
  a first column selection signal processing step of receiving a first column selection signal, which is enabled before the other column selection signals of the plurality of enabled column selection signals, delaying the received first column selection signal for a predetermined time, and performing a first exclusive logic OR (XOR) on the delayed first column selection signal and a signal obtained by buffering the first column selection signal to output a first XOR output signal;
  a second column selection signal processing step of receiving a second column selection signal, which is enabled later than the first column selection signal of the plurality of enabled column selection signals, delaying the received second column selection signal for a predetermined time, and performing a second logic XOR on the delayed second column selection signal and a signal obtained by buffering the second column selection signal to output a second XOR output signal;
  a first enable signal generation step of receiving the first XOR output signal and inverting the level of the first XOR output signal to output the first data line enable signal;
  a second enable signal generation step of receiving the second XOR output signal and inverting the level of the second XOR output signal to output the second data line enable signal; and
  a signal interference compensation enable signal generation step of receiving the first and second XOR output signals and performing a logic XOR on the first and second XOR output signals to output the signal interference compensation enable signal.

18. The method according to claim 17, wherein the first column selection signal processing step comprises:
  a first buffering step of receiving and buffering the first column selection signal to output a buffered first column selection signal;
  a first pulse generation step of receiving the enabled first column selection signal, delaying the enabled first column selection signal for a predetermined time, and performing a logic NAND on the delayed signal and the enabled first column selection signal to output a first pulse signal having a predetermined cycle; and
  a first logic XOR step of receiving the first pulse signal and the buffered first column selection signal and performing a logic XOR on the first pulse signal and the buffered first column selection signal to output the first XOR output signal.

19. The method according to claim 18, wherein the second column selection signal processing step comprises:
  a second buffering step of receiving and buffering the second column selection signal to output a buffered second column selection signal;
  a second pulse generation step of receiving the enabled second column selection signal, delaying the enabled second column selection signal for a predetermined time, and performing a logic NAND on the delayed signal and the enabled second column selection signal to output a second pulse signal having a predetermined cycle; and
  a second logic XOR step of receiving the second pulse signal and the buffered second column selection signal and performing a logic XOR on the second pulse signal and the buffered second column selection signal to output the second XOR output signal.

20. The method according to claim 16, wherein the signal interference compensation step comprises:
  a differential amplification step of respectively applying the second data line signal and the first data line signal to first and second input terminals and outputting a signal obtained by amplifying a voltage difference between the two input signals from a first or a second output terminal; and a unity gain amplification step of applying the amplified signal to the second data signal line and the first or the second input terminal and maintaining a voltage of the first or the second output terminal constant while repeating the differential amplification step.

* * * * *